(12) United States Patent
Rosener

(10) Patent No.: US 9,280,239 B2
(45) Date of Patent: Mar. 8, 2016

(54) TOUCH SENSITIVE CONTROLS WITH WEAKLY CONDUCTIVE TOUCH SURFACES

(75) Inventor: Douglas K Rosener, Santa Cruz, CA (US)

(73) Assignee: Plantronics, Inc., Santa Cruz, CA (US)

( * ) Notice: Subject to any disclaimer, the term of this patent is extended or adjusted under 35 U.S.C. 154(b) by 1841 days.

(21) Appl. No.: 12/125,830

(22) Filed: May 22, 2008

(65) Prior Publication Data

US 2009/0290742 A1 Nov. 26, 2009

(51) Int. Cl.
*H04R 25/00* (2006.01)
*G06F 3/044* (2006.01)
*H03K 17/96* (2006.01)

(52) U.S. Cl.
CPC .............. *G06F 3/044* (2013.01); *H03K 17/962* (2013.01); *H03K 2217/960755* (2013.01)

(58) Field of Classification Search
USPC ............................ 381/370, 384, 375; 427/101
See application file for complete search history.

(56) References Cited

U.S. PATENT DOCUMENTS

| | | | |
|---|---|---|---|
| 3,109,893 A | 11/1963 | Burns | |
| 4,290,052 A * | 9/1981 | Eichelberger et al. | 341/33 |
| 4,330,690 A | 5/1982 | Botros | |
| 6,409,942 B1 * | 6/2002 | Narkis et al. | 252/511 |
| 6,512,834 B1 * | 1/2003 | Banter et al. | 381/386 |
| 6,610,936 B2 * | 8/2003 | Gillespie et al. | 178/18.01 |
| 6,707,093 B2 * | 3/2004 | Siegel et al. | 257/302 |
| 6,762,470 B2 * | 7/2004 | Siegel et al. | 257/414 |
| 6,932,187 B2 * | 8/2005 | Banter et al. | 181/149 |
| 7,395,717 B2 * | 7/2008 | DeAngelis et al. | 73/728 |
| 7,477,242 B2 * | 1/2009 | Cross et al. | 345/179 |
| 7,578,195 B2 * | 8/2009 | DeAngelis et al. | 73/718 |
| 2001/0036291 A1 * | 11/2001 | Pallai | 381/382 |
| 2002/0021278 A1 | 2/2002 | Hinckley et al. | |
| 2002/0068537 A1 | 6/2002 | Shim et al. | |
| 2003/0104647 A1 * | 6/2003 | Siegel et al. | 438/50 |
| 2003/0213624 A1 * | 11/2003 | Cross et al. | 178/18.06 |
| 2004/0017362 A1 * | 1/2004 | Mulligan et al. | 345/173 |
| 2004/0027339 A1 * | 2/2004 | Schulz | 345/173 |
| 2004/0081764 A1 * | 4/2004 | Liu et al. | 427/376.1 |
| 2004/0105538 A1 | 6/2004 | Goebel | |
| 2005/0076824 A1 * | 4/2005 | Cross et al. | 116/205 |
| 2005/0077102 A1 * | 4/2005 | Banter et al. | 181/149 |
| 2005/0221791 A1 | 10/2005 | Angelhag | |
| 2006/0097991 A1 * | 5/2006 | Hotelling et al. | 345/173 |
| 2007/0057167 A1 * | 3/2007 | MacKey et al. | 250/221 |
| 2007/0076897 A1 | 4/2007 | Philipp | |
| 2007/0091076 A1 * | 4/2007 | Schulz | 345/173 |

FOREIGN PATENT DOCUMENTS

| | | |
|---|---|---|
| EP | 0564164 A1 | 10/1993 |
| WO | 00/76177 A1 | 12/2000 |
| WO | 01/63888 A1 | 8/2001 |

* cited by examiner

*Primary Examiner* — Alexander Talpalatski

(57) ABSTRACT

A touch activated control useful for incorporation into, e.g., a DON/DOFF sensor of a communications headset or a touch pad for a cell phone, includes a weakly conductive electrode and a sensor coupled to the electrode and operative to detect a change in parasitic capacitance caused by a change in the proximity of a body to the electrode. The electrode may include a covering made of a weakly conductive material. The weakly conductive property of the electrode enables the prevention of undesirable electrostatic discharge (ESD), user skin irritation and electrode corrosion caused by direct contact between the electrode and the user's skin and also exhibit's a substantially higher sensitivity than electrodes covered with an insulative material.

20 Claims, 3 Drawing Sheets

TOUCH SENSITIVE CONTROLS WITH WEAKLY CONDUCTIVE TOUCH SURFACES

BACKGROUND

This disclosure relates to touch sensitive controls in general, and in particular, to communication headsets having improved electrostatic discharge (ESD) prevention and donned/doffed detection capabilities.

Touch sense controls function by measuring a change in a parasitic capacitance caused by a change in the proximity of a human body to a sensor electrode. When the body moves very close to the electrode, the change in the series combination of the body-to-sensor ground capacitance and the body-to-electrode capacitance is coupled to the sensor, which then acts on the change in capacitance to: 1) detect the proximity or remoteness of the body relative to the electrode; and, 2) effect some control function in response to the proximity or remoteness of the body detected, e.g., activating/deactivating an electrical circuit. The total body-to-electrode capacitance depends on the area of the body in proximity to the electrode. Generally, the smaller the area of the body in proximity to the sensor, the less is the capacitance.

FIG. 1 is a schematic illustration of a communications headset 10 equipped with a conventional "DON/DOFF" sensor 12 that detects whether the headset has been "donned," i.e., placed on the head of a wearer for communication purposes, or "doffed," i.e., removed from the wearer's head. The headset includes a metal or metalized earpiece 14 that is placed within or directly against the ear 16 of the wearer for listening purposes, and which also functions as the electrode of the DON/DOFF sensor 12. The body-to-sensor ground capacitance is represented by $C_1$ and the body-to-electrode capacitance at the point of contact 18 between the electrode 14 and the wearer's ear 16 is represented by $C_2$. Thus, the series combination of the parasitic capacitances coupled to the sensor 12 is given by $C_1+C_2$, which the sensor acts upon to determine whether the headset 10 has been donned or doffed by the wearer.

Generally speaking, the sensitivity of a touch sensor 12 increases when the change in the series parasitic capacitance caused by a touch is maximized. One way to maximize the change in parasitic capacitance is by making the area of contact between the body and the sensor electrode 14 as large as possible. Another way is by bringing the body (for example a finger or an ear) as close to the sensor electrode as possible.

The body-to-sensor capacitance $C_1$ is usually relatively large, so that it is the body-to-electrode capacitance $C_2$ that changes the greatest amount with a touch of the sensor electrode 14. In fact, if the body contacts the metal electrode directly, the maximum change in parasitic capacitance will occur. However, direct contact of the body with the electrode can lead to a number of problems, in that, if the metal electrode comes in direct contact with the wearer's skin, a sudden electrostatic discharge (ESD) may occur, which can cause an uncomfortable shock to the wearer. Furthermore, long term contact between the metal of the electrode and the wearer's skin can result in both skin irritation and corrosion of the electrode, due to the presence of moisture and oils in the skin.

Accordingly, it is conventional to isolate the touch sense electrode 14 from direct contact with the wearer's skin with an electrical insulator, such as a soft plastic or foam rubber covering 20, such as that illustrated in FIG. 1. While this covering 20 overcomes the ESD, skin irritation and electrode corrosion problems outlined above, it also results in an increase in the displacement between the wearer's skin and the electrode 14, thereby reducing the sensitivity of the sensor 12.

As an additional consideration, in the case of a DON/DOFF sensor applied to an earpiece that is held inside of the ear cavity, e.g., a so-called "in-canal" earpiece 14, the housing of the ear-piece that is introduced into the ear typically comprises or is plated with a metal, and is then covered with the electrically insulating cover 20. Ear skin contact is therefore neither complete nor consistent from wearer to wearer, which necessitates covering of the entire earpiece with the cover. However, even if the entire earpiece is covered, the actual contact area between the earpiece 14 and the wearer's ear 16 is often relatively small, thereby reducing sensor sensitivity.

In addition to the reduction in sensor sensitivity caused by the ear-electrode separation resulting from the plastic cover 20 and the inconsistent electrode contact problem, some earpieces require an air gap (not illustrated) between the cover 20 and the earpiece housing 14 for reasons of acoustic efficiency, thereby further reducing sensor sensitivity.

Accordingly, there is a long-felt but as yet unsatisfied need for touch sensitive controls that avoid the above ESD, skin irritation and electrode corrosion problems, yet which also have improved sensor sensitivities relative to those of the prior art.

SUMMARY

In accordance with the exemplary embodiments described herein, touch sensitive controls are provided which avoid the above ESD, skin irritation and electrode corrosion problems, and which also have an improved touch sensor sensitivity.

In one exemplary embodiment, a touch-activated apparatus comprises an electrode, a sensor coupled to the electrode and operative to detect a change in parasitic capacitance caused by a change in the proximity of a body to the electrode, and a weakly conductive covering disposed over the electrode and arranged to be contacted by the body.

In another exemplary embodiment, a touch activated apparatus comprises an electrode, a sensor coupled to the electrode and operative to detect a change in parasitic capacitance caused by a change in proximity of a body to the electrode, and a weakly conductive material interposed between the electrode and the body.

In another exemplary embodiment, a method for improving the sensitivity of a touch activated control of a type that includes an electrode and a sensor coupled to the electrode and operative to detect a change in parasitic capacitance caused by a change in the proximity of a body to the electrode comprises disposing a weakly conductive covering over the electrode, the covering being arranged so as to be contacted by the body.

In another exemplary embodiment, a communications headset having a DON/DOFF sensor includes an earpiece comprising an electrode, a sensor coupled to the earpiece and operative to detect a change in parasitic capacitance caused by a change in the proximity of a wearer's ear to the earpiece, and a weakly conductive covering disposed over the surface of the earpiece and arranged so as to be contacted by the wearer's ear.

In another exemplary embodiment, a touch activated control comprises a touch pad made of a weakly conductive material, an electrode disposed on a lower surface of the pad, a sensor coupled to the electrode and operative to detect a change in parasitic capacitance caused by a change in the proximity of a body to the electrode, and means for activating a circuit in response to an upper surface of the pad being contacted by the body. The control may further comprise means for deactivating the circuit in response to a loss of contact between the electrode and the body.

A better understanding of the above and many other features and advantages of the novel touch sensitive devices of the present invention can be obtained from a consideration of the detailed description of some exemplary embodiments thereof below, particularly, if such consideration is made in conjunction with the appended drawings, wherein like reference numbers are used to refer to like elements illustrated in the various figures thereof.

DETAILED DESCRIPTION

Figure 1:
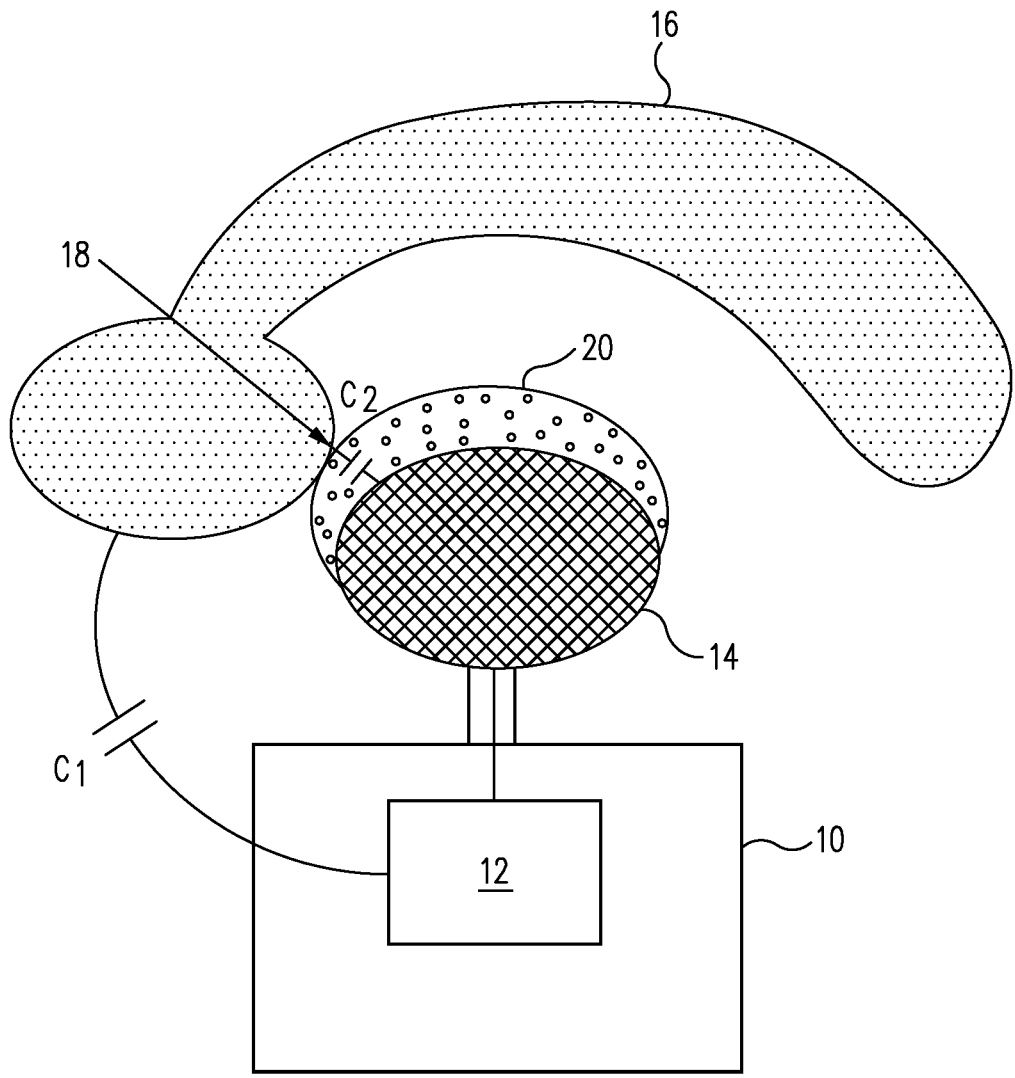
FIG. 1 is a schematic illustration of a communications headset incorporating a DON/DOFF sensor in accordance with the prior art.

FIG. 1 is a schematic illustration of a communications headset 10 incorporating an exemplary embodiment of a DON/DOFF sensor 12 in accordance with the prior art, in which the touch sense electrode 14 is isolated from direct contact with the wearer's skin, viz., the wearer's ear 16, by means of an electrically insulating covering 20. As discussed above, this covering 20 is provided to address the ESD, skin irritation and electrode corrosion problems discussed above. However, as also described above, the insulative cover also serves to increase the displacement between the wearer's skin and the sensor electrode 14, thereby resulting in a substantial reduction in the sensitivity of the sensor 12.

Further, while the electrically insulating nature of the conventional earpiece covering 20 generally serves to reduce the occurrence of ESDs, it also makes it possible for large charge differentials to build up between the wearer's body and the headset 10, and paradoxically, thereby increases the likelihood that an ESD will occur between the wearer's body and the headset. As those of skill in the art will appreciate, the possibility of this type of ESD occurrence has been eliminated in the laboratory and in manufacturing environments by coupling laboratory and manufacturing workers to apparatus or machines with weakly conductive materials, such as with so-called "grounding straps." The weak electrical coupling provided by such straps enables electrostatic charge differentials between the workers and the apparatus or machines to dissipate slowly, but prevents high current discharges through the worker's body.

By parity of reasoning, in the context of the present disclosure, it has been discovered that, by substituting a weakly electrically conductive covering 120 for the conventional electrically insulating covering 20 of the DON/DOFF sensor electrode 114, the possibility of an undesirable ESD occurring between the headset 100 and the wearer's body can be reduced. The weakly conductive electrode covering 120 not only prevents the skin irritation and electrode corrosion problems discussed above, but of importance, also imbues touch sensors 112 incorporating such coverings with a much greater touch sensitivity.

Figure 2:
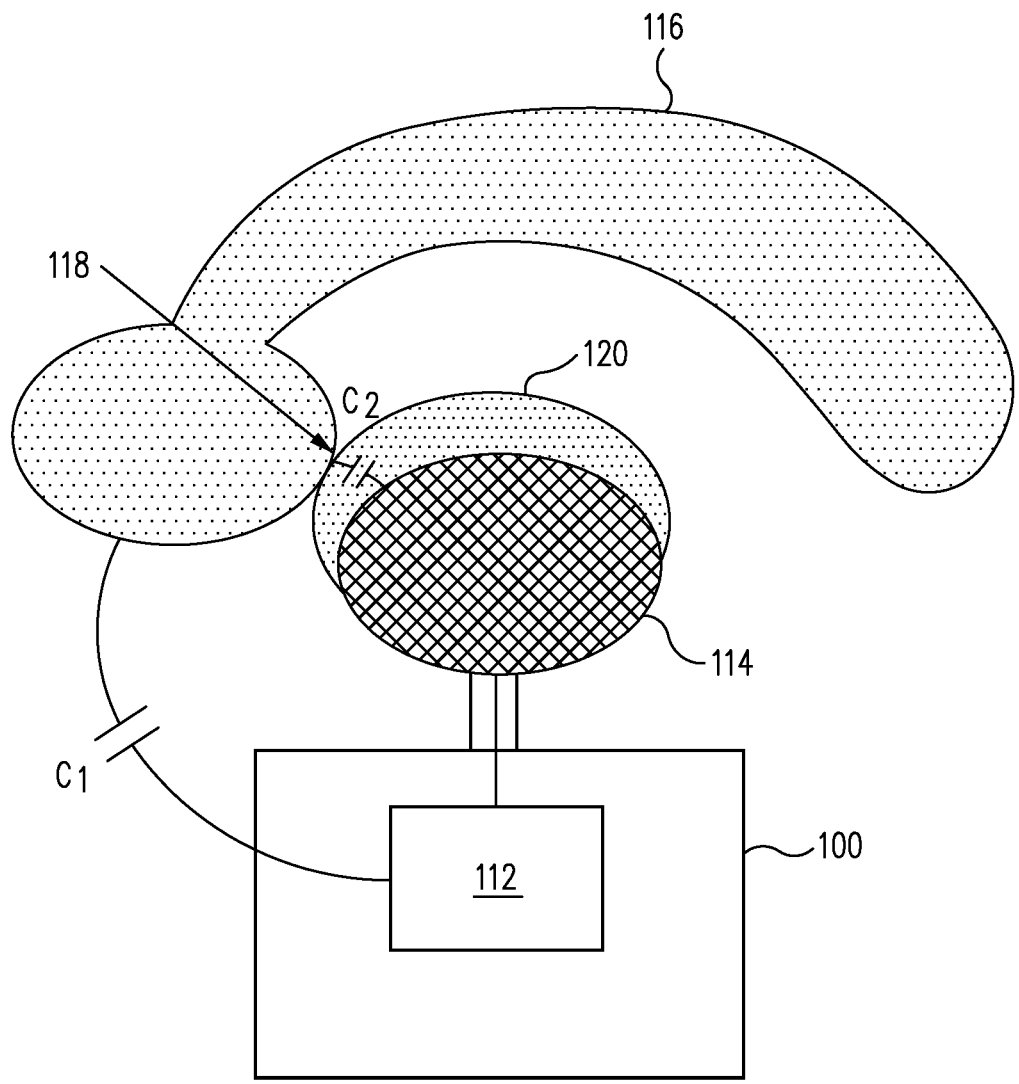
FIG. 2 is a schematic illustration of a communications headset incorporating an exemplary embodiment of a DON/DOFF sensor in accordance with the present disclosure; and, FIG. 3 is a schematic illustration of an exemplary embodiment of a touch pad in accordance with the present disclosure.

FIG. 2 is a schematic illustration of a communications headset 100 incorporating a DON/DOFF sensor 112 in accordance with the present disclosure. As may be seen from a comparison of FIGS. 1 and 2, the headset 100 of the present disclosure is substantially similar to the headset 10 with the conventional DON/DOFF sensor 12 of FIG. 1, and differs from the latter primarily by the presence of a weakly electrically conductive covering 120 on the earpiece/sensor electrode 114 of the headset. Such headsets may also incorporate a microphone (not illustrated) that may be coupled to the headset by an adjustable boom that enables the microphone to be efficiently positioned relative to the user's mouth. In some embodiments, the headset 100 may be coupled to the user's head with a resilient "over-the-head" or "behind-the-head" headband (not illustrated), or alternatively, by means of a hook that extends over the wearer's ear 116.

Additionally, it should be understood that, although a so-called "in-the-ear" earpiece type of headset 100 is illustrated and described by way of example herein, the teachings of this disclosure are equally applicable to other types of headsets, e.g., "supra-aural" and "circumaural" headsets, as well.

In the exemplary headset embodiment of FIG. 2, the weakly-conductive covering 120 is disposed over the earpiece/sensor electrode 114, which may be made of a metal or a plastic that is metalized on an interior or exterior surface for good conductivity. Alternatively, the housing may be made of a weakly-conductive plastic.

The weakly conductive covering 120 may be made of a variety of materials, including, for example, "ESD A 2800-75 A," comprising a "static dissipative" thermoplastic polyolefin elastomer (TEO) material manufactured by the RTP Company of Winona, MN, having a volume resistivity of 1.0 E3-9.9E9 ohm.cm, a surface resistivity of 1.0E6 -9.9E12 ohm/sq and a surface resistance of 1.0E5 9.9E11 ohm. Other weakly conductive materials can be confected by "loading" elastomeric materials that are otherwise electrically insulative, such as rubber, polyurethane (PU), or the like, with particles of an electrically conductive material, e.g., carbon, silver or copper.

In the exemplary DON/DOFF sensor 112 of the headset 100 of FIG. 2, which is inserted into the wearer's ear 116, the weakly conductive covering 120 serves to maximize the change in parasitic capacitance $C_1+C_2$ during a touch sense because the body-to-electrode capacitance $C_2$ is shunted with a substantially lower impedance, effectively lowering the overall parasitic series capacitance of the sensing circuit and placing virtually the entire surface of the earpiece/electrode covered by the covering in electrical contact with the wearer's skin. Hence, the parasitic capacitance is no longer dependent on the actual area of contact, for example, the single point of contact 118 shown in FIG. 2.

Thus, by using an ESD conductive (i.e., a lossy, but conductive) material as a covering for a touch sensor electrode, it is possible not only to reduce such problems as ESD, skin irritation and electrode corrosion resulting from a direct body-to-metal contact, but also to substantially improve the sensitivity of the touch sense control.

Figure 3:
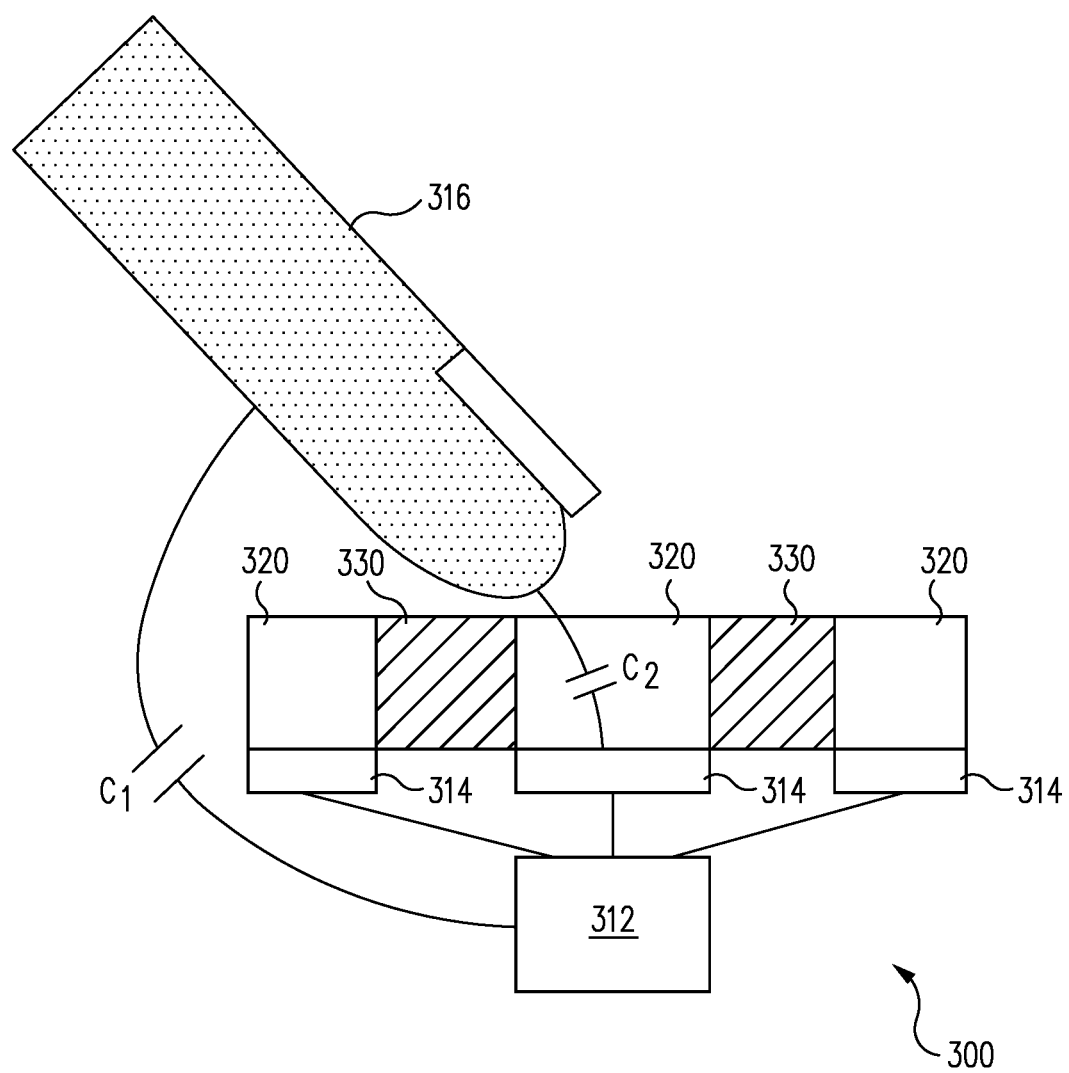

For example, FIG. 3 is a schematic illustration of an exemplary embodiment of a touch pad 300 in accordance with the present disclosure. The exemplary touch pad illustrated, which is of a type that might be used to control an array of switches, or as a key pad of a calculator, cell phone, keyboard, or the like, comprises a touch sensor 312 having three touch sensitive electrodes 314 coupled to it, each adapted to sense a respective touch by the tip or pad of a user's finger 316. Disposed above each of the electrodes 314 is a layer, or covering 320, of a weakly conductive material of the type discussed above, so as to provide the same benefits discussed above in the context of the exemplary headset DON/DOFF sensor 112, viz., the prevention of ESD, skin irritation and electrode corrosion resulting from a direct body-to-metal contact, and an improvement in the sensitivity of the sensor.

As in the DON/DOFF sensor of FIG. 2, the weakly-conductive layer 320 can be provided over a metalized or metal housing, or alternatively, the housing itself can be constructed of a weakly-conductive plastic, with the electrode{s} 314 being disposed or formed on a lower or interior surface thereof, e.g., by plating. Of importance however, is if the touch pad 300 incorporates a plurality of electrodes 314, such as in the exemplary embodiment illustrated in FIG. 3, it is necessary to provide a plurality of electrically insulating separating areas 330 between the respective conducting areas 320 so as to prevent all of the "buttons" of the pad being triggered simultaneously by a touch of only one of the buttons by the user's finger 316.

As those of skill in this art will by now appreciate, many modifications, substitutions and variations can be made in the materials, processes and implementations of the touch sensitive devices of the present disclosure without departing from its spirit and scope. In light of this, the scope of this disclosure should not be limited to that of the particular embodiments illustrated and described herein, as they are only by way of some examples thereof, but instead, should be fully commensurate with that of the claims appended hereafter and their functional equivalents.

What is claimed is:

1. A touch-activated apparatus, comprising:
an electrode;
a sensor coupled to the electrode and operative to detect a change in parasitic capacitance caused by a change in the proximity of a body to the electrode; and,
a weakly conductive covering disposed over and in direct contact with the electrode and arranged to be contacted by the body.

2. The apparatus of claim 1, wherein the weakly conductive covering comprises an electrostatic charge dissipative material.

3. The apparatus of claim 1, wherein the weakly conductive covering comprises a thermoplastic polyolefin elastomer (TEO) having a volume resistivity of from about 1.0E3 to about 9.9E9 ohm.cm.

4. The apparatus of claim 1, wherein the weakly conductive covering comprises an elastomer containing particles of an electrically conductive material.

5. The apparatus of claim 1, wherein:
the electrode comprises an earpiece of a communications headset; and,
the apparatus comprises a DON/DOFF sensor of the headset.

6. A touch pad incorporating the apparatus of claim 1.

7. A touch activated apparatus, comprising:
an electrode;
a sensor coupled to the electrode and operative to detect a change in parasitic capacitance caused by a change in proximity of a body to the electrode; and
wherein a weakly conductive material in direct contact with the electrode and interposed between the electrode and the body.

8. The apparatus of claim 7, wherein:
the electrode comprises an earpiece of a communications headset; and,
the apparatus comprises a DON/DOFF sensor of the headset.

9. A touch pad incorporating the apparatus of claim 7.

10. A method for improving the sensitivity of a touch activated control of a type that includes an electrode and a sensor coupled to the electrode and operative to detect a change in parasitic capacitance caused by a change in the proximity of a body to the electrode, the method comprising disposing a layer of a weakly conductive material in direct contact with the electrode and between the electrode and the body, the layer being arranged so as to be contacted by the body.

11. A communications headset having a DON/DOFF sensor, comprising:
an earpiece comprising an electrode;
a sensor coupled to the earpiece and operative to detect a change in parasitic capacitance caused by a change in the proximity of a wearer's ear to the earpiece;
a weakly conductive covering disposed over and in direct contact with the surface of the earpiece and arranged so as to be contacted by the wearer's ear when the headset is donned.

12. The headset of claim 11, further comprising:
a microphone; and,
means for holding the headset on the wearer's head such that the earpiece is disposed in contact with the wearer's ear and the microphone is disposed so as to receive sound from the user's mouth.

13. The headset of claim 11, further comprising:
means for activating a circuit in response to a detection of the headset being donned; and,
means for deactivating the circuit in response to a detection of the headset being doffed.

14. The headset of claim 11, wherein the weakly conductive covering comprises an electrostatic charge dissipative material.

15. The headset of claim 11, wherein the weakly conductive covering comprises a thermoplastic polyolefin elastomer (TEO) having a volume resistivity of from about 1.0E3 to about 9.9E9 ohm.cm.

16. The headset of claim 11, wherein the weakly conductive covering comprises an elastomer containing particles of an electrically conductive material.

17. A touch activated control, comprising:
a pad made of a weakly conductive material;
an electrode disposed in direct contact with a lower surface of the pad;
a sensor coupled to the electrode and operative to detect a change in parasitic capacitance caused by a change in the proximity of a body to the electrode; and,
means for activating a circuit in response to an upper surface of the pad being contacted by the body.

18. The control of claim 17, further comprising means for deactivating the circuit in response to a loss of contact between the upper surface of the pad and the body.

19. The control of claim 18, wherein the electrode covering comprises an electrostatic charge dissipative material, a thermoplastic polyolefin elastomer (TEO) having a volume resistivity of from about 1.0E3 to about 9.9E9 ohm.cm, or an elastomer containing particles of an electrically conductive material.

20. The control of claim 17, wherein the apparatus comprises a DON/DOFF sensor of a communications headset.

* * * * *